(12) United States Patent
Gottin et al.

(10) Patent No.: US 12,719,497 B2
(45) Date of Patent: Aug. 25, 2026

(54) SAX-BASED FILTERING FOR RLTC TIME SERIES COMPRESSION

(71) Applicant: Dell Products L.P., Round Rock, TX (US)

(72) Inventors: Vinicius Michel Gottin, Rio de Janeiro (BR); Rômulo Teixeira de Abreu Pinho, Niterói (BR); Paulo de Figueiredo Pires, Niterói (BR); Alex Laier Bordignon, Niterói (BR); Franklin Jordan Ventura Quico, Niterói (BR)

(73) Assignee: Dell Products L.P., Round Rock, TX (US)

(*) Notice: Subject to any disclaimer, the term of this patent is extended or adjusted under 35 U.S.C. 154(b) by 205 days.

(21) Appl. No.: 18/638,546

(22) Filed: Apr. 17, 2024

(65) Prior Publication Data

US 2025/0330196 A1 Oct. 23, 2025

(51) Int. Cl.
*H03M 7/30* (2006.01)
*H03M 7/40* (2006.01)

(52) U.S. Cl.
CPC ....... *H03M 7/3062* (2013.01); *H03M 7/3059* (2013.01); *H03M 7/4087* (2013.01)

(58) Field of Classification Search
CPC . H03M 7/3062; H03M 7/4087; H03M 7/3059
See application file for complete search history.

(56) References Cited

U.S. PATENT DOCUMENTS 11,403,310 B2 * 8/2022 Kornmeier .......... H03M 7/3059
11,924,069 B2 * 3/2024 Fauber .................... G06F 18/20

OTHER PUBLICATIONS

S. Omid, "Refined lightweight temporal compression for energy-efficient sensor data streaming," EEE 5th World Forum on Internet of Things (WF-IoT), pp. 550-553, 2019.
J. Lin, E. Keogh, L. Wei and S. Lonardi, "Experiencing SAX: a novel symbolic representation of time series," 2007.
J. Lin, E. Keogh, S. Lonardi and B. Chiu, "A Symbolic Representation of Time Series, with Implications for Streaming Algorithms," DMKD Journal, 2007.
N. Ruta, N. Sawada, K. Mckeough, M. Behrisch and J. Beyer, "Sax navigator: Time series exploration through hierarchical clustering," in 2019 IEEE Visualization Conference (VIS), 2019.
E. Keogh, "SAX homepage," [Online]. Available: https://www.cs.ucr.edu/~eamonn/SAX.htm. [Accessed Dec. 14, 2022].

* cited by examiner

*Primary Examiner* — Khai M Nguyen
(74) *Attorney, Agent, or Firm* — Workman Nydegger

(57) ABSTRACT

One example method includes at a source, at a source, performing a symbolic aggregation process on a series of raw data generated and/or collected by the source, to create a series of symbols, inputting, by the source, the series of raw data and the series of symbols to a lossy compression algorithm operating at the source, running, at the source, the lossy compression algorithm to obtain a series of raw values, and a sparse series of raw values, and transmitting, by the source to a target, the series of raw values, and the sparse series of raw values.

20 Claims, 14 Drawing Sheets

| | Baseline | | | S-RLTC (Illustrative Embodiment) | | |
|---|---|---|---|---|---|---|
| | Ratio | Time (s) | Error | Ratio | Time (s) | Error |
| **0.05** | 1.01 | **1.21** | **1.41E-03** | **1.1839** | 1.41 | 6.80E-03 |
| **0.1** | 1.07 | **1.19** | 3.36E-02 | **1.2119** | 1.47 | **2.20E-02** |
| **0.15** | 1.16 | **1.15** | 6.32E-02 | **1.2416** | 1.40 | **3.87E-02** |
| **0.2** | 1.21 | **1.09** | 8.66E-02 | **1.2791** | 1.40 | **6.14E-02** |
| **0.25** | 1.26 | **1.06** | 1.13E-01 | **1.3014** | 1.41 | **8.27E-02** |

| | Baseline | | | S-RLTC (Illustrative Embodiment) | | |
|---|---|---|---|---|---|---|
| | Ratio | Time (s) | Error | Ratio | Time (s) | Error |
| 0.05 | **37.94** | 0.585 | 3.32E-02 | 37.94 | 1.62 | 3.32E-02 |
| 0.1 | 58.21 | 0.583 | 7.38E-02 | 58.21 | 1.48 | 7.38E-02 |
| 0.15 | 1000.00 | 0.536 | 9.28E-02 | 1000.00 | 1.84 | 9.28E-02 |
| 0.2 | 1282.05 | 0.556 | 1.23E-01 | 1282.05 | 1.53 | 1.23E-01 |
| 0.25 | 581.40 | 0.603 | 1.58E-01 | 581.40 | 1.49 | 1.58E-01 |

| | Baseline | | | S-RLTC (Illustrative Embodiment) | | |
|---|---|---|---|---|---|---|
| | Ratio | Time (s) | Error | Ratio | Time (s) | Error |
| 0.05 | **37.94** | 0.585 | 3.32E-02 | 37.94 | 1.62 | 3.32E-02 |
| 0.1 | 58.21 | 0.583 | 7.38E-02 | 58.21 | 1.48 | 7.38E-02 |
| 0.15 | 1000.00 | 0.536 | 9.28E-02 | 1000.00 | 1.84 | 9.28E-02 |
| 0.2 | 1282.05 | 0.556 | 1.23E-01 | 1282.05 | 1.53 | 1.23E-01 |
| 0.25 | 581.40 | 0.603 | 1.58E-01 | 581.40 | 1.49 | 1.58E-01 |

SAX-BASED FILTERING FOR RLTC TIME SERIES COMPRESSION

COPYRIGHT AND MASK WORK NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyrights whatsoever.

FIELD OF THE INVENTION

Embodiments of the present invention generally relate to time series data compression. More particularly, at least some embodiments of the invention relate to systems, hardware, software, computer-readable media, and methods, for performing time series data compression in circumstances where resources for performing the data compression are constrained, and in which there may be a need to perform the data compression relatively quickly.

BACKGROUND

The task of time series compression, that is, compression of time series data, is an important task in many domains. Such domains may include, for example, the IoT (Internet of Things) domain, especially regarding smart sensors, as well as Digital Twin scenarios. These example domains may be characterized by time series data collected, such as by IoT devices, at a high frequency, often generating a massive volume of data that must be transmitted to the cloud or edge for processing and storage. Thus, data compression in the sensor or other IoT device is desirable or even necessary, either due to the limitations of computational resources that these devices have or due to the current saturation in the network due to the communication between a, potentially very large number of, interconnected devices.

That is, such scenarios often present various problems. One of these problems is constrained resources, that is, resources that are constrained in terms of energy and computational power, such that embedding compression methods in IoT devices is not practical because the methods cannot be performed in a timely or effective manner. Even with the use of lossy compression schemes, which may tend to place lower demands on IoT device resources, increased efficiency, and lower consumption of resources, is still desirable. Another typical problem concerns the timeliness of the compression. In many scenarios, it is important to compress and send data as fast possible, managing the tradeoff of processing speed, and associated costs, with the signal loss introduced by the compression in the case of lossy compression algorithms.

BRIEF DESCRIPTION OF THE DRAWINGS

In order to describe the manner in which at least some of the advantages and features of the invention may be obtained, a more particular description of embodiments of the invention will be rendered by reference to specific embodiments thereof which are illustrated in the appended drawings. Understanding that these drawings depict only typical embodiments of the invention and are not therefore to be considered to be limiting of its scope, embodiments of the invention will be described and explained with additional specificity and detail through the use of the accompanying drawings.

DETAILED DESCRIPTION OF SOME EXAMPLE EMBODIMENTS

Figure 1:
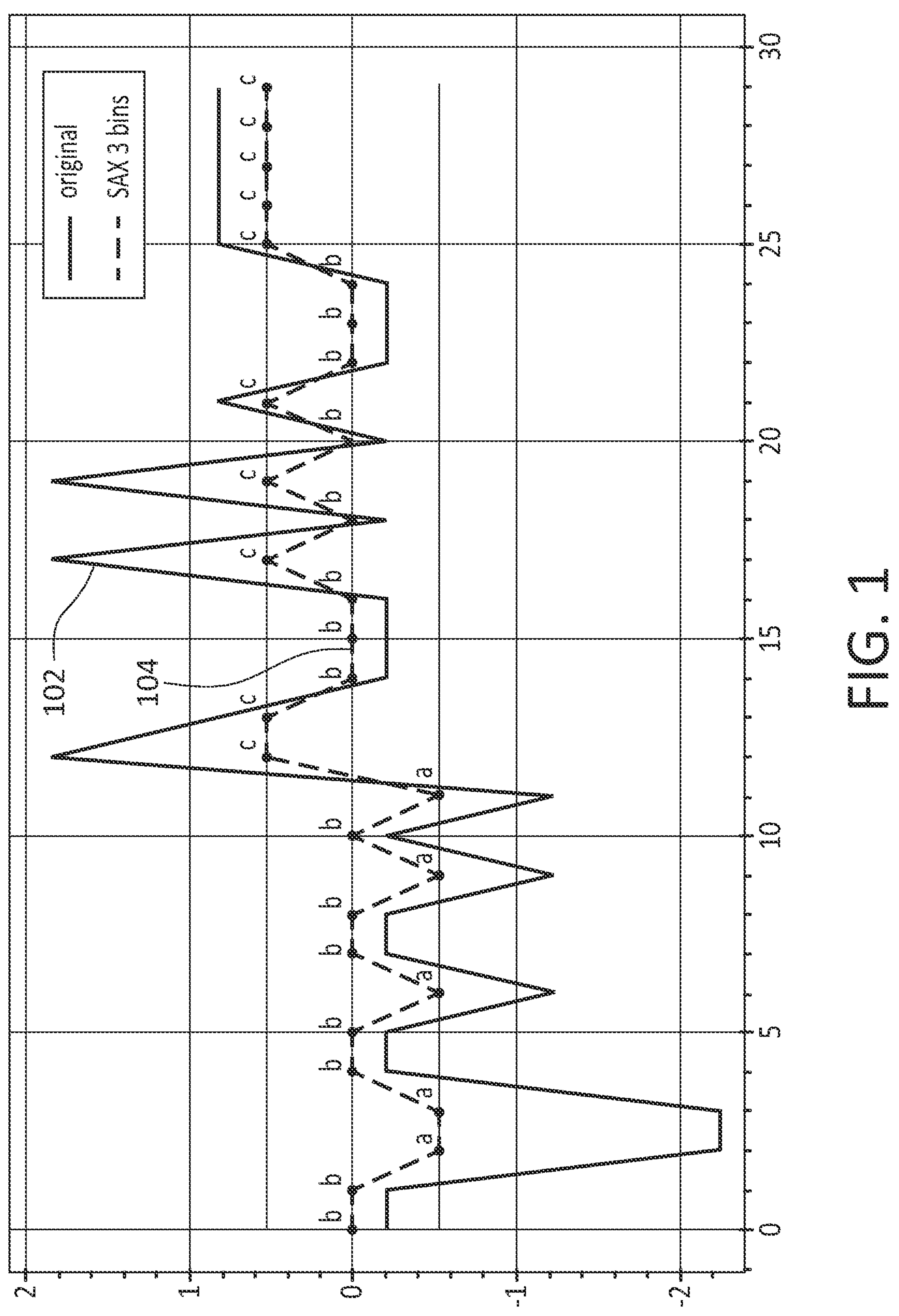
FIG. 1 discloses aspects of a SAX representation (symbolic) over an original time series.

Embodiments of the present invention generally relate to time series data compression. More particularly, at least some embodiments of the invention relate to systems, hardware, software, computer-readable media, and methods, for performing time series data compression in circumstances where resources for performing the data compression are constrained, and in which there may be a need to perform the data compression relatively quickly.

One example embodiment comprises a method for compressing time series data at a network device, such as an IoT for example, before the data is transmitted to a gateway. For example, lossy compression may be applied to raw r data at the source, such as the IoT device, for efficient communication to a target, such as the gateway. One example embodiment of the method comprises the following operations: performing, at the data source, a symbolic aggregation process, such as the SAX approach; inputting, to the S-RLTC algorithm, the raw series r and the resulting series of symbols z' that were generated by the symbolic aggregation process; running the S-RLTC algorithm to obtain both a series c' and a sparse series of raw values r'; and, communicating c' and r' to the target for reconstruction into c. It is noted that, in an embodiment, the series c' and/or the sparse series of raw values r', may, or may not, be compressed.

Embodiments of the invention, such as the examples disclosed herein, may be beneficial in a variety of respects. For example, and as will be apparent from the present disclosure, one or more embodiments of the invention may provide one or more advantageous and unexpected effects, in any combination, some examples of which are set forth below. It should be noted that such effects are neither intended, nor should be construed, to limit the scope of the claimed invention in any way. It should further be noted that nothing herein should be construed as constituting an essential or indispensable element of any invention or embodiment. Rather, various aspects of the disclosed embodiments may be combined in a variety of ways so as to define yet further embodiments. For example, any element(s) of any embodiment may be combined with any element(s) of any other embodiment, to define still further embodiments. Such further embodiments are considered as being within the scope of this disclosure. As well, none of the embodiments embraced within the scope of this disclosure should be construed as resolving, or being limited to the resolution of, any particular problem(s). Nor should any such embodiments be construed to implement, or be limited to implementation of, any particular technical effect(s) or solution(s). Finally, it is not required that any embodiment implement any of the advantageous and unexpected effects disclosed herein.

In particular, one advantageous aspect of an embodiment is that an embodiment may provide for improved, relative to conventional techniques, efficiency of data compression, and for higher compression ratios. An embodiment may be implemented without imposing additional material overhead on the data source. An embodiment may provide for relatively smaller reconstruction errors for data samples. An embodiment may maintain the feature of a bounded error from a hypothetical baseline compression approach. Various other advantages of one or more example embodiments will be apparent from this disclosure.

A. Aspects of an Example Context for an Embodiment

The following is a discussion of aspects of one context for an embodiment of the invention. This discussion is not intended to limit the scope of the invention, or the applicability of the embodiments, in any way.

A.1 Symbolic Aggregate Approximation (SAX)

In general, the symbolic aggregate approximation (SAX) algorithm, employed in one example embodiment, works by binning continuous time series intervals, transforming each sequence into a sequence of symbols, usually represented by letters of the alphabet. Aspects of the SAX algorithm, or simply 'SAX,' are disclosed in the following documents, both of which are incorporated herein in their respective entireties by this reference: (1) "J. Lin, E. Keogh, L. Wei and S. Lonardi, '*Experiencing SAX: a novel symbolic representation of time series,'* 2007" ("J. Lin-1"); and (2) "J. Lin, E. Keogh, S. Lonardi and B. Chiu, '*A Symbolic Representation of Time Series, with Implications for Streaming Algorithms,' DMKD Journal,* 2007" (J. Lin-2").

The process carried out by the SAX algorithm may be similar to a quantization process for a finite number of symbols, but in SAX data windows are used, and each whole window is approximated by only one symbol. FIG. 1 discloses an example original time series 102, and the corresponding SAX symbols are shown at 104. In this example case, the SAX window contains only one sample, that is, each raw sample in the original time series 102 is converted into a symbol 104. Thus, FIG. 1 discloses a, symbolic, SAX representation 104 of the original time series 102.

There may be various advantages to storing the SAX representation 104 of a time series 102. For example, the SAX representation is highly compressible, and as such, a compressed SAX representation may exhibit a high compression ratio. As well, the SAX representation enables a user to look for patterns in the original data without the need to look at the complete data, which may be a time-consuming process. One example of an approach that leverages these characteristics is disclosed in "N. *Ruta*, N. Sawada, K. McKeough, M. Behrisch and J. Beyer, '*Sax navigator: Time series exploration through hierarchical clustering,' in* 2019 *IEEE Visualization Conference* (*VIS*), 2019," which is incorporated herein in its entirety by this reference. In light of these properties, applications may store SAX metadata to speed up database searching. Information concering research on SAX, its derivations, such as iSAX for example, and its applications is disclosed in "E. Keogh, 'SAX homepage,' [Online]. Available: https://www.cs.ucr.edu/~eamonn/SAX.htm. [Accessed 14 Dec. 2022]," which is incorporated herein in its entirety by this reference.

A.2 Refined Lightweight Temporal Compression (RLTC)

The RLTC algorithm, or simply "RLTC," is disclosed in "S. Omid, '*Refined lightweight temporal compression for energy-efficient sensor data streaming,' EEE 5th World Forum on Internet of Things* (*WF-IoT*), pp. 550-553, 2019" ("Omid"), which is incorporated herein in its entirety by this reference. RLTC is an extension of Lightweight Temporal Compression (LTC), "an energy-efficient lossy compression algorithm that maintains a memory usage and per-sample computational cost in O(1)" that "provides a trade-off between compression ratio and accuracy using an error bound." See Omid.

With regard to its operation, the RLTC algorithm "uses a binning approach to widen the search space and increase the LTC's compression ratio and reduce its dynamic energy consumption, which is characterized by CPU computations and radio transmissions, without compromising the error bound. ( . . . ) RLTC algorithm adds negligible overhead to the memory usage and latency of LTC." Id. The RLTC algorithm defines anchors, one for each parametrized bin, from which straight lines defining respective upper and lower bounds are projected. All consecutively following values that fall within the area constrained by the bounds, up to a maximum parametrized error, are 'compressed' with respect to those anchors. That is, those values are not, and need not be, communicated to a gateway or other target, and may instead be obtained by interpolation of the previous, and next, anchors. An example of an initial iteration of RLTC over data is disclosed in FIG. 2, part (a).

Figure 2:
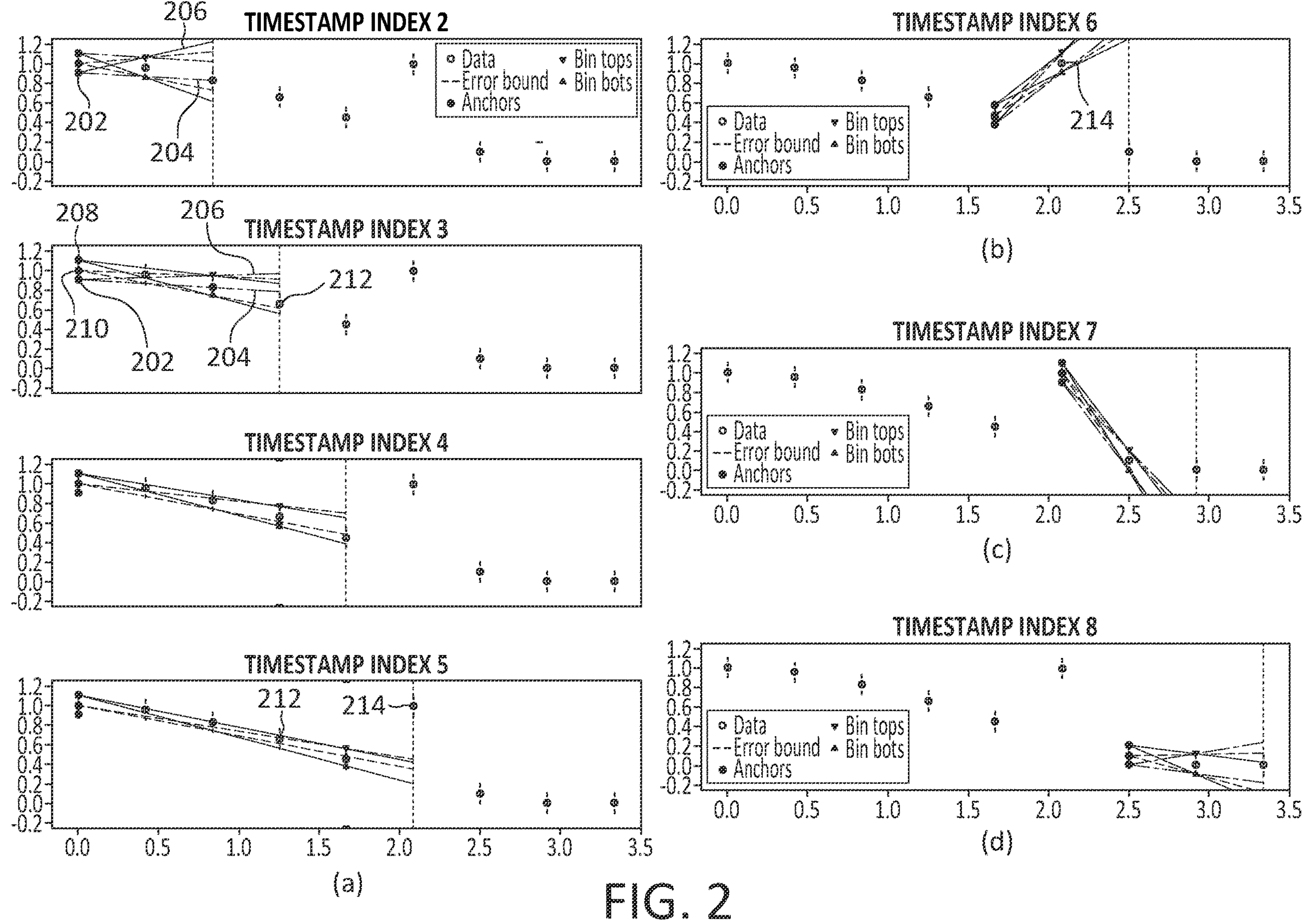
FIG. 2 discloses aspects of an iteration of RLTC

More specifically, FIG. 2 discloses an iteration of RLTC parametrized with 3 bins (anchor points), compressing points from timestamp to up to and including $t_4$ in a single iteration, as at part (a), then a second iteration at part (b), and third iteration at part (c), which define new anchors (at $t_4$ and at $t_5$, respectively) that do not include any following points; and final iteration (d) in which the remaining points are compressed with respect to anchor in $t_6$. The series is compressed to one point each at $t_0$, $t_4$, $t_5$, $t_6$ and $t_8$ (the end of the series).

FIG. 2 shows how the respective bounds associated with each anchor 202 are adjusted for each new point. For example, FIG. 2 shows how the lower 204 (and upper 206) bound(s) for the anchor 202 move(s) upward (downward) from timestamp index 2 to timestamp index 3. FIG. 2 further discloses, at timestamp index 3 for example, how one or more anchors, such as the anchors 208 and 210, may allow for compression of a point 212 even when one anchor, such as the anchor 202, does not. It is noted that in the following timestamp index 4, only the remaining anchors are considered. At timestamp index 5, it can be seen that the point 212 would not be acceptable for any remaining anchor. This prompts the end of the first iteration of the algorithm.

A new iteration, starting at the last added point 214 (timestamp index 4) is started. This is shown in FIG. 2, part (b). The iteration starting in $t_4$ (b) finds that no following points are accepted within any of the anchors. Thus, it ends immediately. The same happens for the third iteration, shown in FIG. 2, part (c). The final iteration in FIG. 2, part (d), starting at $t_8$, compresses the remaining points.

The example of RLTC in FIG. 2 thus illustrates a circumstance to which one embodiment may be directed. That is, FIG. 2 discloses that a single point to which does not follow the trend in the data is responsible for several iteration breaks, which are considerably more expensive computationally than the straightforward case of the RLTC algorithm, and thus causes the setting of anchors that sub-optimally represent previously 'compressed' points.

Figure 3:
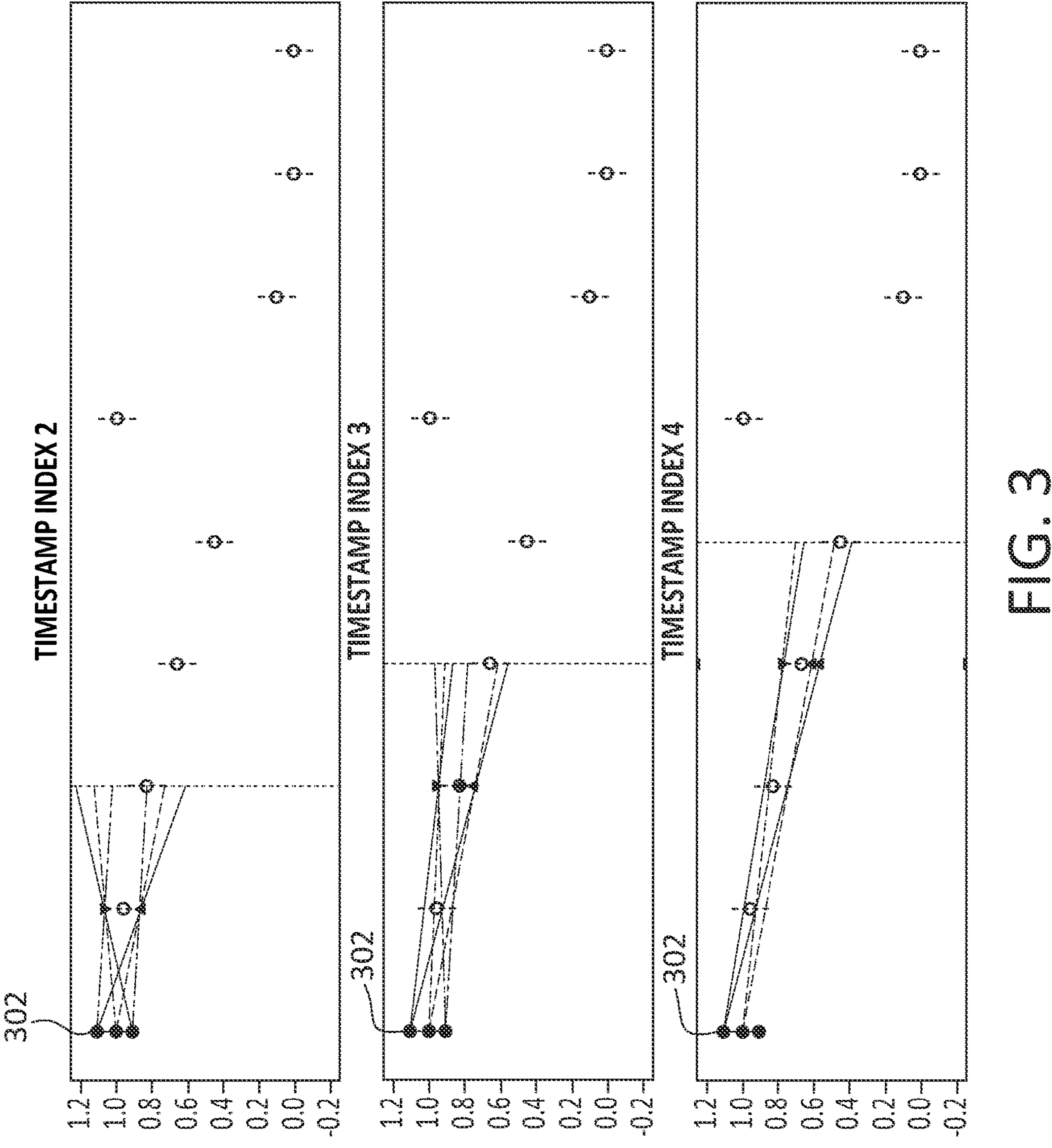
FIG. 3 discloses an alternative, compared with FIG. 2, execution of RLTC.

By way of contrast, FIG. 3 shows the example of FIG. 2, but assuming that the troublesome point was not part of the data. That is, FIG. 3 discloses an alternative execution of RLTC on a favorable case. In this case, only one iteration is necessary to compress the whole data from the anchor 302 at to $t_0$ the end of the series, that is, from timestamps 1 through 4.

Figure 4:
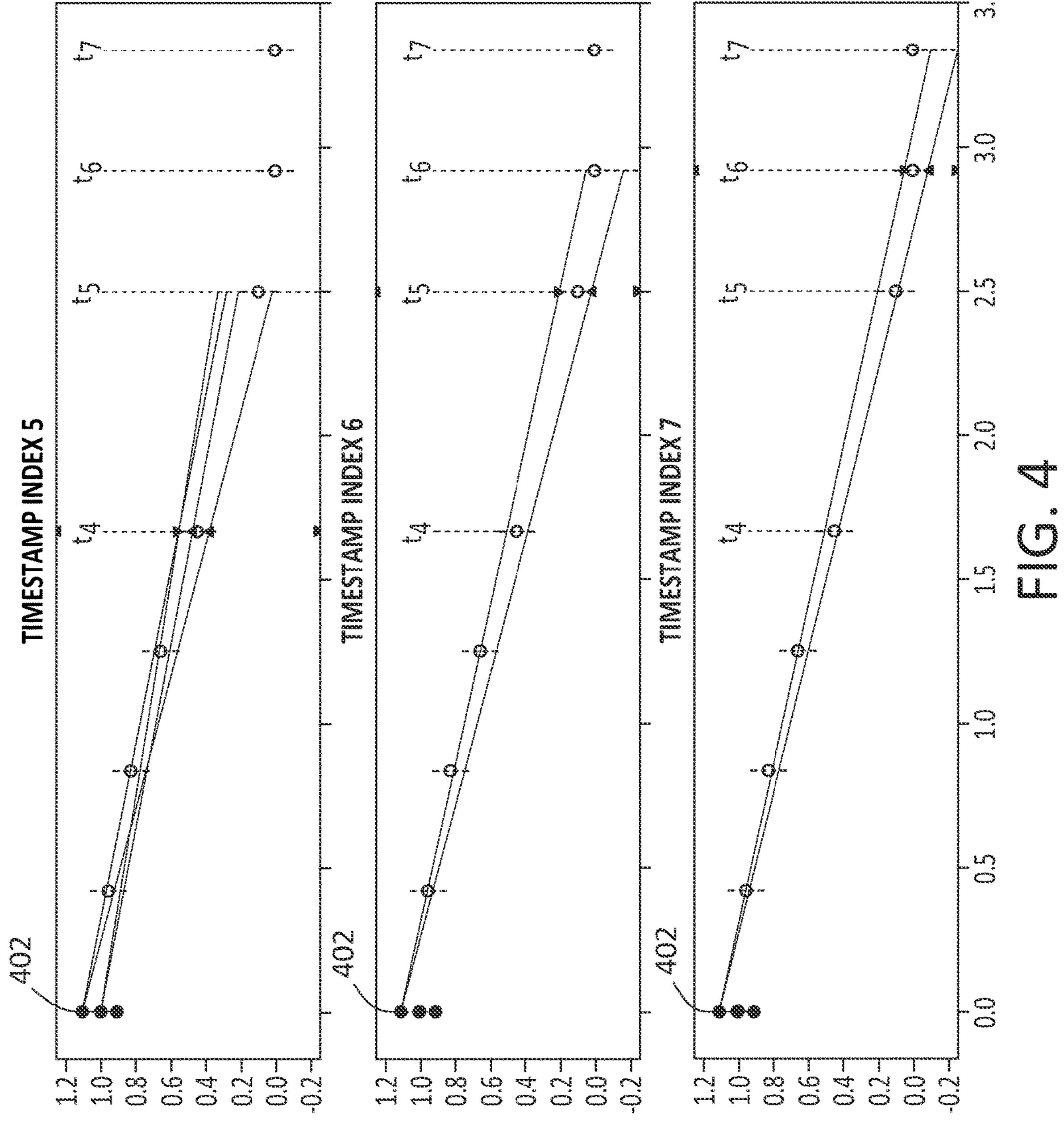
FIG. 4 discloses another alternative, compared with FIGS. 2 and 3, execution of RLTC.

Similar to the case of FIG. 3, FIG. 4 discloses another alternative execution of RLTC on a favorable case. In this example, only one iteration is necessary to compress the whole data from the anchor 402 at to $t_0$ the end of the series, that is, from timestamps 5 through 7. It is noted that as shown in FIG. 4, the RLTC is able of dealing with timestamp indexes that are not equally spaced as they were in the example of FIG. 2.

B. Overview of Aspects of an Example Embodiment

Example embodiments may be employed in various domains, examples of which include, but are not limited to, digital twins, and environments that include a network of IoT devices, such as sensors for example. Any other device (s) capable of generating and/or collecting data may employed in an embodiment, and the scope of this disclosure is not limited to sensors.

One example embodiment may assume, and employ, a lossy compression algorithm being applied over a time series data stream. One algorithm applicable to cases with the constraints described above is the RLTC referred to herein, particularly with respect to energy efficiency. Despite the algorithm efficiency and good compression results it may provide in practice, an embodiment recognizes, and operates accordingly, that there may be benefits to selectively turning off the compression algorithm, at least since it performs a per-sample iterative check which may be costly in terms of time and resources consumed.

Further, it is a characteristic of RLTC, and similar algorithms, that it is generally more effective, and computationally efficient, for relatively more compressible series. That is, upon determining that a sample is not compressible, the RLTC algorithm must perform additional steps in comparison to the steps needed to be performed by RLTC when it finds a sequence of compressible samples. Moreover, by including such incompressible samples in its workings, it imposes a larger error for other samples. Thus, turning the compression algorithm off altogether during periods in which the data is highly uncompressible, as may be done in an embodiment, may provide gains in compression quality at the cost of little, or no, additional time and computational resources.

To that end, an embodiment may possess a quantization scheme and quick check to determine whether the RLTC, or similar, algorithm must be applied or not to compress a given time series fragment. An embodiment may be based on a quantization of the values in the time series to determine whether the RLTC algorithm needs to consider a sample at all, avoiding any computation of the RLTC algorithm for portions of the data that are likely not compressible.

For implementing this quantization, an embodiment may employ the SAX algorithm. SAX applies a dimensionality reduction to the data, generating a discretization that produces symbols with equiprobability. Thus, the quantization process, either sample-by-sample or windowed, depending on the parametrization, of SAX may be performed in time series of many different applications. With the discretization bounds having been pre-determined, it may be trivial to determine the 'symbol' of a new data sample, or window of data samples. Leveraging that information to guide the application of per-window compression algorithms such as RLTC is therefore a viable approach.

As the foregoing, and the rest of this disclosure make clear, an embodiment may possess various useful features and aspects, although no embodiment is required to possess any of such features or aspects. The following examples are illustrative.

An embodiment may define and implement a policy, exploiting a known quantization scheme, to determine whether a per-sample compression algorithm is applied to a time series, applicable in online fashion. Further, an embodiment may employ an inexpensive outlier detection, possibly based on the same quantization scheme, to further optimize the efficiency of the compression algorithm. One or more embodiments may be employed in a wide variety of domains, including, but not limited to, various IoT scenarios. More generally, however, the scope of the invention is not limited to any particular domain(s). Elsewhere herein, example experimental results from an IoT scenario are presented. It is noted that while SAX and RLTC are known techniques, no similar approaches are known by the inventors to exist that combine both with a higher-level orchestration that promotes efficiency and ensures compressibility/efficiency tradeoff guarantees.

C. Detailed Discussion of Aspects of an Example Embodiment

C.1 Baseline Scenarios

Figure 5:
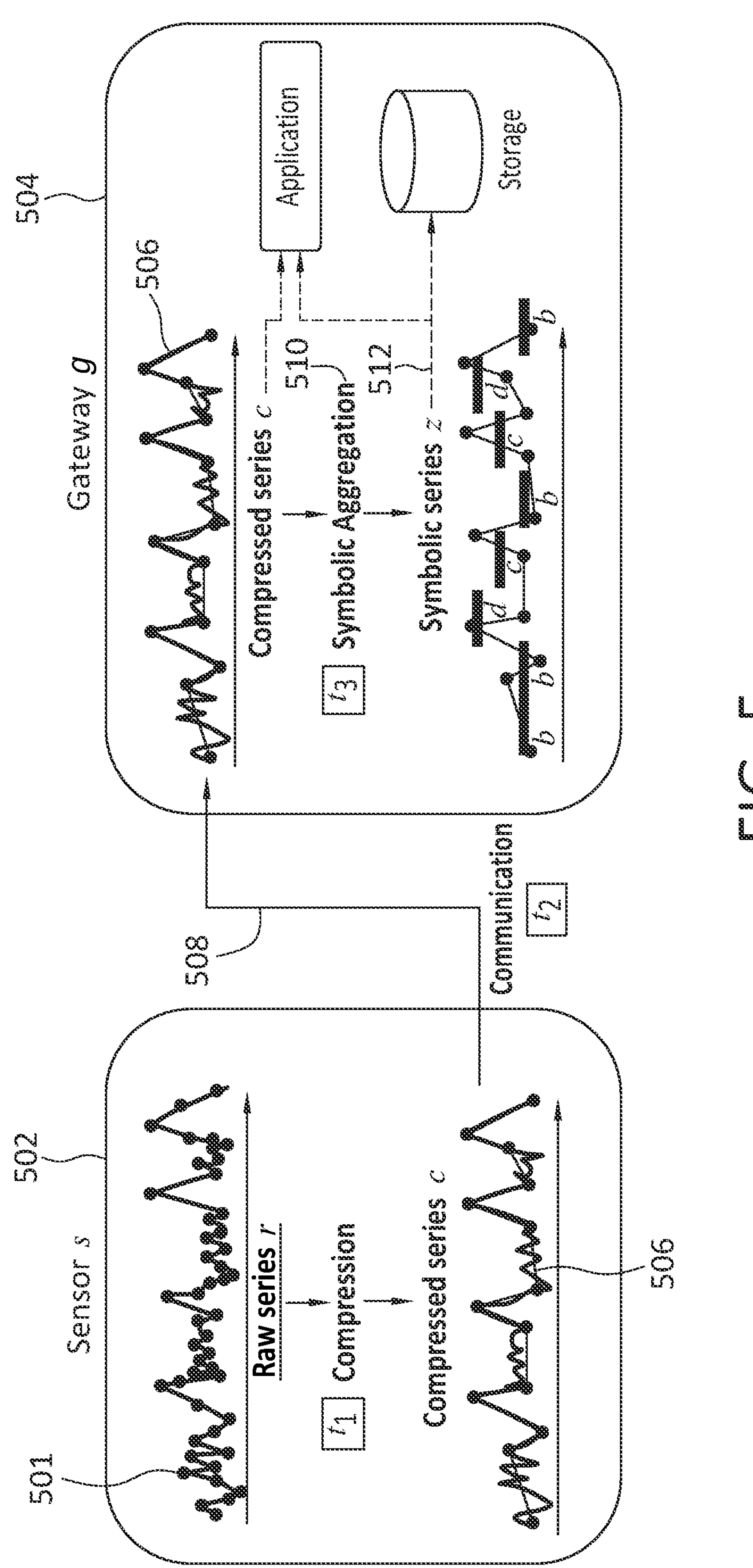
FIG. 5 discloses a hypothetical baseline compression scenario and associated architecture.

One embodiment considers an environment in which a source, such as a data generator and/or data collector, such as a sensor or far-edge infrastructure, communicates time series data to a target, typically a gateway or near-edge infrastructure appliance. FIG. 5 discloses an example baseline scenario in which raw data 501 is compressed by a sensor 502 and communicated to a gateway 504. Particularly, FIG. 5 discloses a scenario in which lossy compression is applied by the sensor 502 to raw r data 501 for efficient communication to the target, a gateway 504 in this example. Times $t_1$, for applying the RLTC algorithm, $t_2$, for communicating compressed data c, and $t_3$, for the gateway 504 aggregation of data received from the sensor 502, are referenced here for later discussion. In an embodiment, the time series data compression performed at/by the source is performed using the RLTC algorithm. In an embodiment, the straightforward application of RLTC at the sensor as in FIG. 5 may be considered as a baseline approach in the experimental validation results, discussed elsewhere herein.

Recall from the earlier discussion herein that, in an embodiment, the RLTC algorithm performs an iterative check for each data sample, or simply 'sample,' to determine whether that data sample is compressible, allowing for a maximum error bound. When a sample is found such that the maximum error bound would be infringed, the RLTC algorithm performs extra steps to set/reset the 'anchor' points for future compression. Thus, RLTC, and similar algorithms, may generally be more effective and efficient, than other algorithms, for more compressible series. Accordingly, an embodiment may embody the intuition that it may pay off to perform additional pre-processing of the raw data to greatly enhance the efficiency of the compression algorithm, at least in terms of the time and/or resources needed to perform the compression.

As shown in FIG. 5, the raw data r 501 may be compressed, such as with the RLTC algorithm, at the source, such as sensor 504, to yield compressed data c 506. This compressed data c 506 may then be communicated 508 to a target such as the gateway 504. An embodiment may abstract the details of the infrastructure, including the communication channel, to focus on the aspects related to the compression.

As also indicated in FIG. 5, a typical usage for the compressed data c 506 at the gateway 504 may comprise an aggregation approach, such as SAX 510 for example, for indexing, storage and/or processing purposes. The aggregated and compressed data z 512 is an outcome of the application of SAX 510 to the compressed data c 506.

C.2 SAX-Based Filtering for Efficient RLTC

Figure 6:
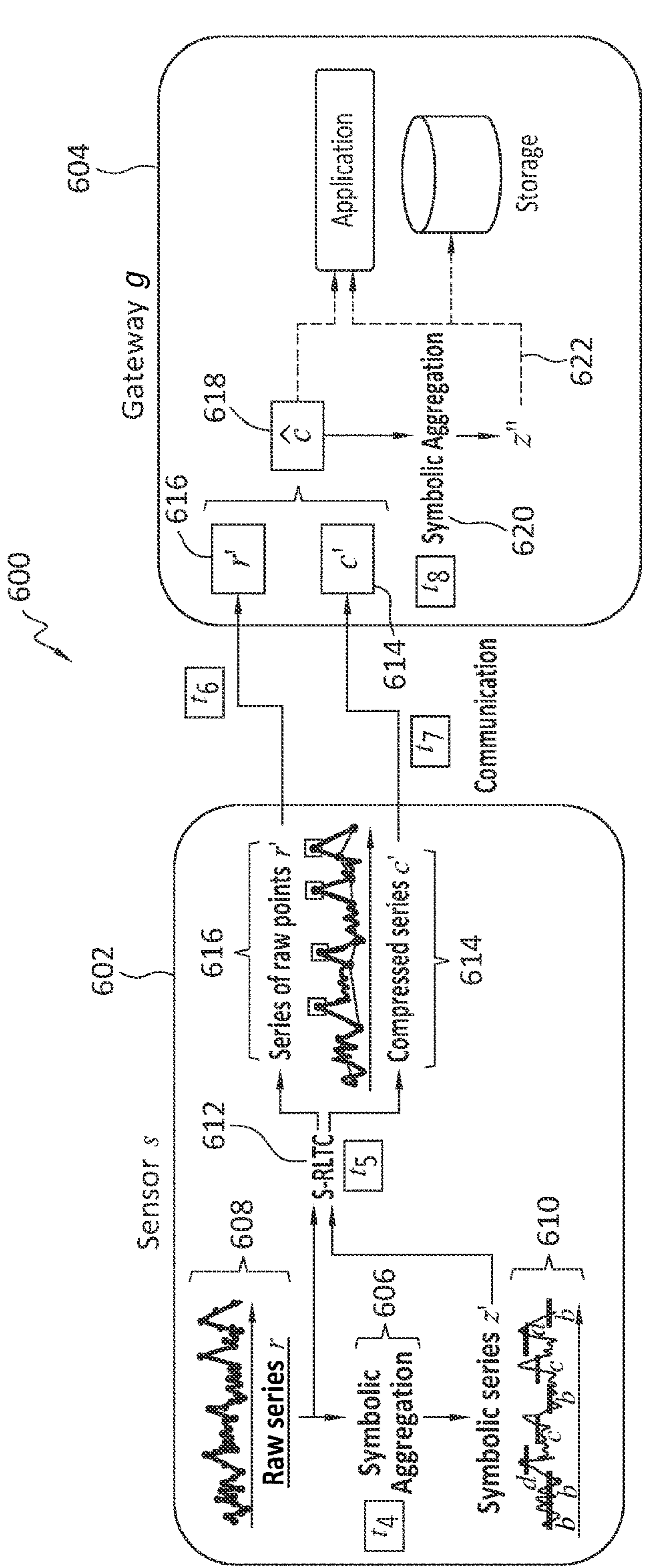
FIG. 6 discloses an compression scenario and associated architecture, according to one embodiment.

In contrast with the example of FIG. 5, one embodiment performs an aggregation process, such as SAX, at the source, rather than at the target. An example of this alternative approach is disclosed in FIG. 6. In particular, FIG. 6 discloses an arrangement 600 comprising a source 602 and a target 604. Various processing times are indicated for operations that may be performed. For example, processing times $t_4$, $t_6$, which may be neglibible, are added in an embodiment. Time $t_7$ indicates an improvement, that is, a reduction, relative to similar times such as $t_2$ in the baseline approach disclosed in FIG. 5. In FIG. 6, the time $t_5$ to carry out the S-RLTC algorithm is comparable to the compression time $t_1$ in the baseline approach of FIG. 5.

With continued reference to the example of FIG. 6, an embodiment may perform, possibly using the SAX approach, a symbolic aggregation of raw series r 608 at the source 602 to generate a symbolic series, that is, a series of symbols z' 610. Both the raw series r 608 and the resulting series of symbols z' 610 may then be input to the S-RLTC algorithm 612. As noted, S-RLTC is an extension and adaptation of RLTC that enhances the quality of the compression while avoiding unnecessary processing overheads due to sporadic fluctuations in value in the raw series r 608. In an embodiment, the S-RLTC algorithm 612 yields both a compressed series c' 614 and a, typically, very sparse series of raw values r' 616. Next, both the compressed series c' 614 and the raw values r' 616 are communicated to the target 604, such as a gateway, for reconstruction into ĉ 618. In an embodiment, SAX 620 may be applied to the reconstructed data to yield z" 622.

Following are some example comparisons between the baseline example embodiment of FIG. 5, and the example embodiment of FIG. 6: [1] the approach disclosed in FIG. 6 achieves better reconstruction of the raw data at the gateway-formally, given a function $E(a, b)\rightarrow\mathbb{R}$ that computes an error metric for the reconstruction of dataset b from a compressed dataset a, $E(r, \hat{c})<E(r, c)$ is obtained; [2] the approach disclosed in FIG. 6 does not add significant processing overhead at the sensor—(a) processing costs of the symbolic aggregation (represented by the processing time $t_4$) are added—these do not exist in the baseline approach of FIG. 5, but are not expensive in any event, and (b) S-RLTC algorithm is not significantly costlier than the baseline RLTC algorithm ($t_5\approx t_1$); [3] the approach disclosed in FIG. 6 may alleviate communication overheads between the sensor and the gateway—(a) communication costs $t_6$ of the raw points r' are typically very small, and sometimes negligible, as it is a very sparse series of values, and (b) communication costs ty of the compressed series c' are smaller in the approach in FIG. 6 than in the baseline approach of FIG. 5, as S-RLTC compressed the data significantly more ($c'<c$); [4] the approach disclosed in FIG. 6 does not incur in any additional processing costs at the gateway, as the processing costs of the aggregation of r' and c' into ĉ are negligible and the symbolic aggregation of ĉ into z" is comparable to the aggregation in the baseline approach (that is, $t_8\approx t_3$); and, [5] as a consequence of 1., $E(r, z'')\leq E(r, z)$; that is, the resulting symbolic aggregation at the gateway in the FIG. 6 approach will be of comparable or better representative power of the raw data.

C.2.1 Aggregation at the Sensor

In an embodiment, the aggregation at the sensor is performed in similar fashion as to the aggregation at the gateway in the baseline approach. In one embodiment, and in the experiments disclosed herein, this comprises a straightforward application of the SAX algorithm. It is noted that, in effect, S-RLTC may only require a fast and effective quantization of the data and, while SAX is a candidate approach, alternative approaches may suffice.

C.2.2 S-RLTC Algorithm

The S-RLTC algorithm adds to the basic RLTC algorithm an analysis of whether the current pattern is compressible, leveraging the symbolic representation. Thus, an intuition underlying the algorithm is as follows:

- leverage predetermined sets of sequences of symbols that correlate to compressible and to uncompressible patterns of the time series; and
- in the execution of RLTC, upon determining an anchor and considering whether it adequately captures a next point $p_i=(t_i, v_i)$ at timestamp $t_i$ and value $v_i$, determine whether the current sequence of symbols-including the symbol for $p_i$-determines an uncompressible pattern:
  - if so, the point $p_i$ is ignored, and added to series of raw points r';
  - otherwise, $p_i$ is considered as it normally would be by the RLTC procedure.

This mechanism and the avoidance of edge cases are discussed below. Additional considerations and details are discussed in the following subsections, following the pseudocode of the 'Algorithm 1 SAX-RLTC' disclosed at page 1 of the Appendix hereto, which is a part of this disclosure and incorporated herein in its entirety by this reference.

C.2.2.1 Pseudocode

The following references to 'pseudocode' refer to the Algorithm 1 SAX-RLTC disclosed at page 1 of the Appendix, unless otherwise specified. In general, the pseudocode adopts the following definitions:

All trigonometric functions assume arcs in radians.

sax(R, k)

obtains, from a sequence of real values R, normalized according to the z-score metric, a sequence of symbols (e.g., 'a', 'b', 'c', 'd', . . . ) according to the SAX algorithm considering an alphabet with k symbols.

Notice that in the configuration presented in FIG. 6, there is the series z' precomputed and provided as input to RLTC. In that case, this procedure is a simple access to the z' series at the current timestamp index.

In the pseudocode, however, an online approach is indicated, in which symbols are generated as the values in the raw series become available. This may be necessary for applications that require prompt communication of the sensor values to the gateway, and is the version adopted in our implementation for the experiments discussed elsewhere herein.

anchors (base, a, ε)

returns the set of a points that uniformly discretize the error range of amplitude ε centered on base.

anchors (base, a, εupper, εlower)

similar overloading function that accepts different upper and lower ranges.

getAdmissibleRegion (z, p, ε)

returns two vectors, named ul and II, whose ith positions contain the lines that connect the ith anchor, respectively, to the upper point (p+E) and lower point (p-ε) from the range of admissible points p.

The region defined between the pair of lines that contains an anchor is the one that can contain a line whose distance in the real dimension, that is, in the vertical dimension, to each of the points under analysis, that is, those with timestamp between the of base and p, is less than the admissible increase in uncertainty, so that this straight line is able to approximate these points.

This is directly comparable to the same procedure in the original RLTC algorithm.

getAdmissibleRegion (z, p, supper, slower)

similar overloading function that assumes different upper and lower ranges.

evaluateLine (L, z, i)

Returns the value that the line L (which intercepts the anchor z) assumes at the instant of time i.

updateLines (UL, LL, tsAnchor, tsLastPoint, tsActualPoint)—see the description in the pseudocode ('Algorithm 2 updateLines') on page 2 of the Appendix—this procedure resembles the same procedure as in the original RLTC as well.

C.2.2.2 Preprocessed Compressible and Uncompressible Patterns

In an embodiment, the S-RLTC receives, as input, two structures that determine compressible and uncompressible patterns in the time series data. These structures are:

$\mathcal{C}_k$, comprising sequences of symbols that correspond to compressible patterns; and $\mathcal{I}_K$, comprising sequences of symbols that correspond to incompressible patterns. The symbols in both of these structures may be used to determine which points are sent as part of a raw series. Both structures may be defined as sets of n-tuples of SAX symbols, considering a k-symbol alphabet. Example n-tuples in $\mathcal{I}_K$ are represented graphically in FIG. 7.

Figure 7:
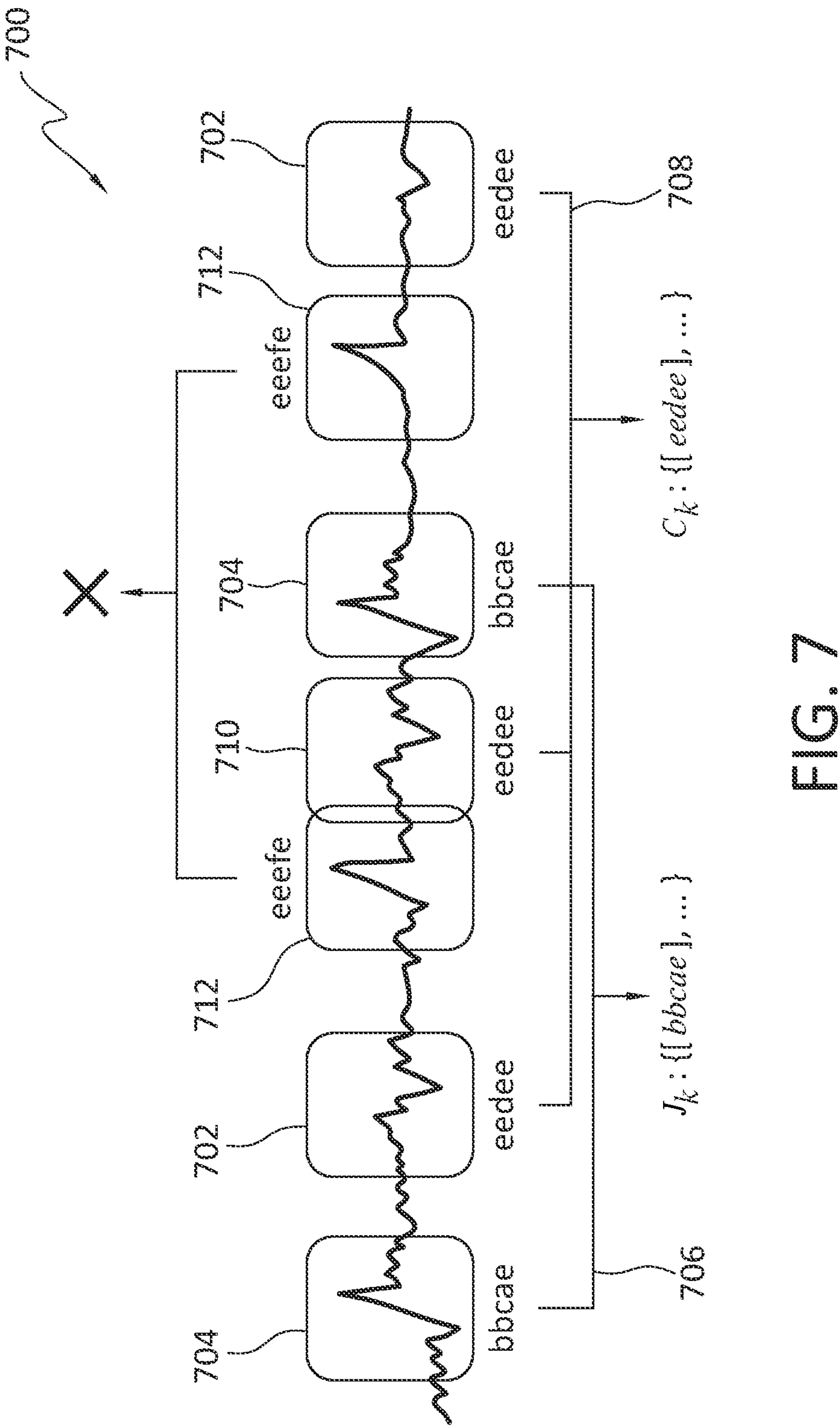
FIG. 7 discloses a representation of compressible, and incompressible, patterns, according to one embodiment.

In particular, FIG. 7 discloses an example representation 700 of a compressible pattern 702 and an incompressible pattern 704, possibly determined from analysis of historical data, with the sets 706 and 708, respectively, $\mathcal{I}_K$, $\mathcal{C}_k$, assumed as inputs for the S-RLTC algorithm. Particularly, FIG. 7 discloses how the sets $\mathcal{I}_K$ 706 and $\mathcal{C}_k$ 708 may be expected to include symbol sequences that correspond to patterns that are typically incompressible and compressible, respectively. It is noted that one example embodiment comprises an offline process in which a historical dataset is used to determine the frequency with which pattern is compressible by the baseline RLTC algorithm. This approach was used in the experiments described elsewhere herein, but is provided here only for explanation purposes.

In the example of FIG. 7, the sequence bbcae 704 is found to be always incompressible, and this is added to $\mathcal{I}_K$ 706 The sequence eedee 710 is found to be always compressible, and thus added to $\mathcal{C}_k$ 708. The sequence eeefe 712 however, is found to be only sometimes compressible, and therefore is not added to either $\mathcal{I}_K$ 706 or $\mathcal{C}_k$ 708. In the example of FIG. 7, the aforementioned sequences are 5-uples, while in the pseudocode for the algorithm at page 1 of the Appendix, and the example implementation discussed in connection with the experiments below, 3-uples are employed. The change for the size of the tuple should be straightforward, implying only minor changes to the algorithm.

C.2.2.3 Determining Points to Send as Raw Data

Recall from an intuition underlying S-RLTC that the early determination of an incompressible pattern causes the algorithm (see page 1 of the Appendix) to disregard the sample. With regard to the set $\mathcal{I}_K$ (see, e.g., 706 in FIG. 7) it is possible, by preprocessing data from the same domain, to determine a sequence of symbols that is never, or only seldom, compressible and thus will always cause RLTC to break the current anchors.

Figure 8:
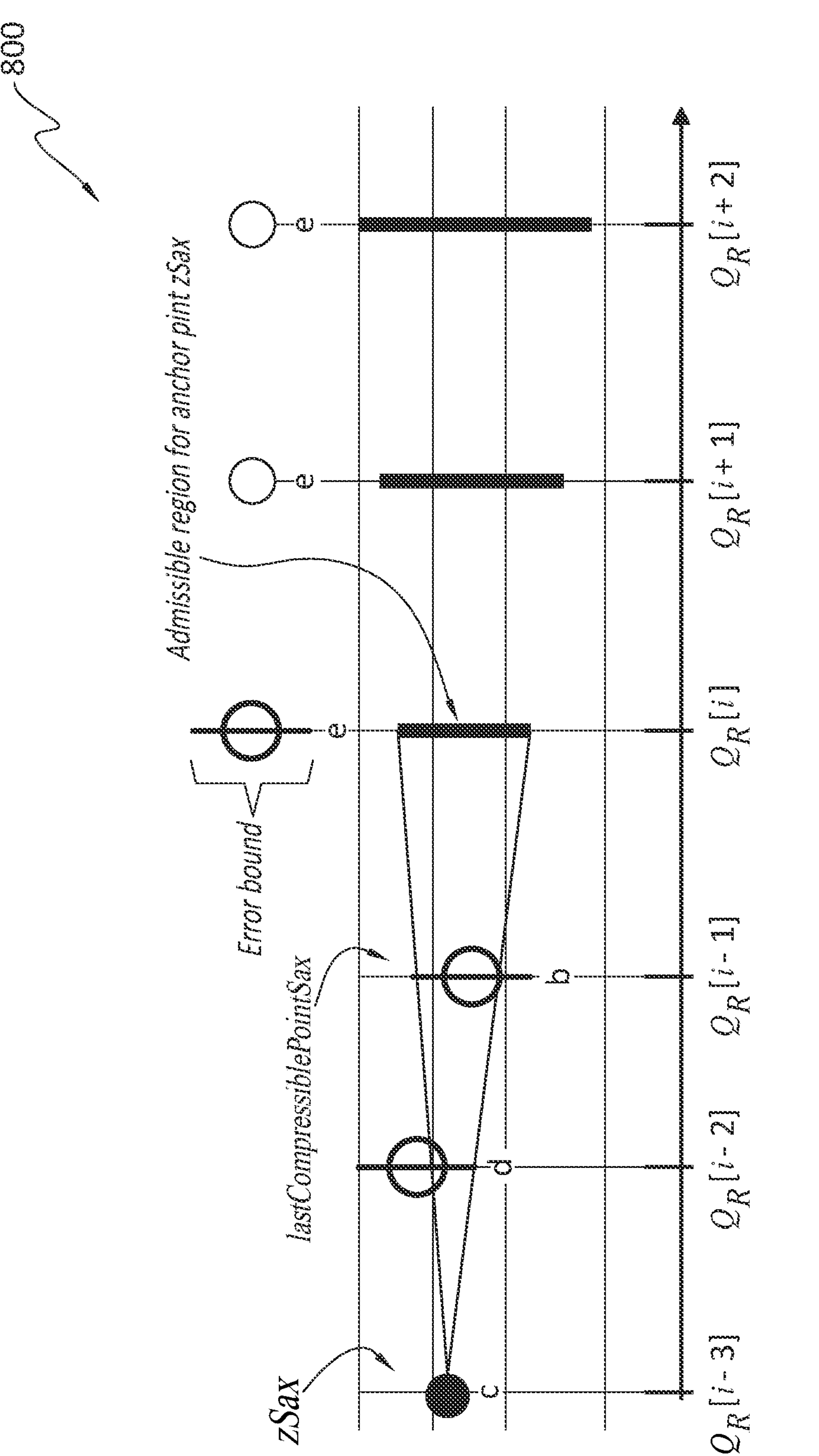
FIG. 8 discloses aspects of the operation of the S-RLTC algorithm with regard to whether or not a particular point falls within an admissible region.

Hence, and with reference now to the example 800 of FIG. 8, the S-RLTC may consult the current symbols, comparing them to $\mathcal{I}_K$ to determine whether the next sample $Q_R[i]$ may be disregarded and added to the series of raw points. This corresponds to lines 15-18 of the algorithm (see Appendix) and is disclosed in FIG. 8. Particularly, FIG. 8 discloses that the S-RLTC algorithm checks whether a current point $Q_R[i]$, plus or minus an error bound, is within the admissible region. In this case, the check should fail, as the admissible region and the error bound limits of the point do not overlap.

It is noted that to compose the currentSaxTuple, the following may be considered: the anchor point zSax ($Q_R[i-3]$), the last compressible point $Q_R[i-1]$, and the current point $Q_R[i]$ (line 13 of the algorithm—see Appendix). An embodiment may not consider the actual last observed sequence 'dbe.' In fact, an embodiment may skip all points between the anchor and the last compressible point. This may be necessary for the algorithm (see Appendix) to be applicable in dynamic fashion, capable of disregarding certain points without influencing the admissible region of the anchors.

Consider now an edge case of the algorithm in which a shift in phase would cause all samples to be sent as raw values. An example of this edge case is disclosed at 900 in FIG. 9, following up from the previous example in the next step i. Particularly, FIG. 9 discloses an edge case 900 in which a shift in phase for a long period would case a large sequence of 'm' points to be sent, unnecessarily, as raw data.

Figure 9:
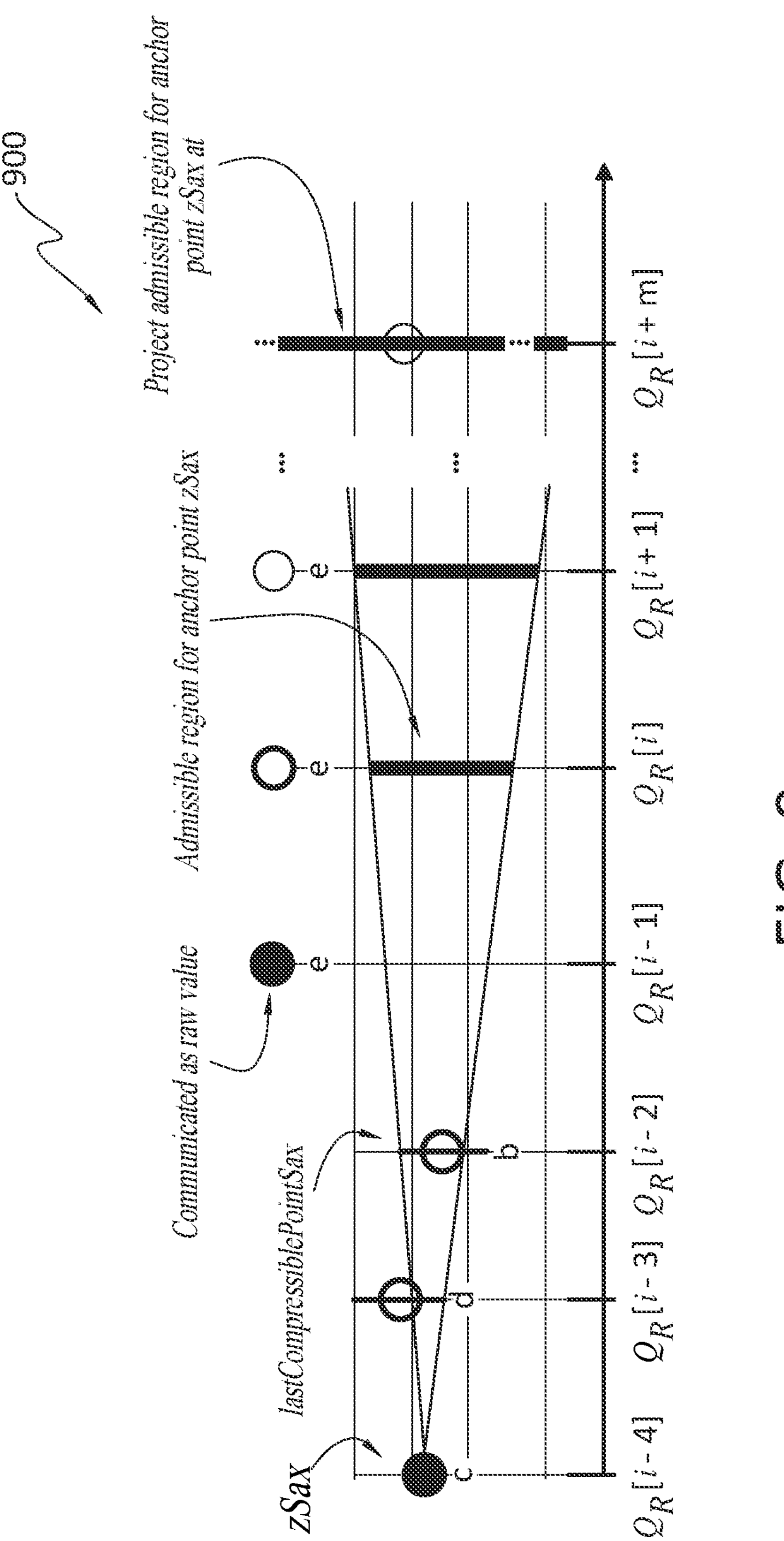
FIG. 9 discloses aspects of an example edge case for S-RLTC involving a phase shift.

As shown in FIG. 9, if the point $Q_R[i-1]$ (previously $Q_R[i]$) was sent as raw, it does not update the lastCompressiblePointSax value. Hence, if the next sample (and the next one, and the next one . . . ) again results in an incompressible currentSaxTuple, the S-RLTC algorithm would send all of those samples as raw values, until encountering sample $Q_R$[i+m] which, as shown, falls within the admissible region. An embodiment may resolve this issue by adding an additional forward-looking check. Notice also that in the check of line 15 (see Appendix), an embodiment also checks whether the following sequence (forewardSaxTuple), given by the next three values $Q_R$[i], $Q_R$[i+1] and $Q_R$[i+2] (line 14), is not compressible, such that it does not belong to $\mathcal{C}_k$.

Considering again the example of FIG. 8, even if the currentSaxTuple 'che' is incompressible, the forewardSaxTuple 'eee' belongs to the set $\mathcal{C}_k$. Hence, an embodiment may still consider the current point $Q_R$[i] in the iteration. Since its value (plus or minus the error bound) is outside the admissible region for the anchor point, it will cause that updated admissible region of the anchor to become empty and, therefore, break the anchor iteration (see line 26 in the Appendix). In the follow-up, a new anchor may be determined, and the next m samples will be compressed by the algorithm as usual.

FIG. 9 also presents another issue. Particularly, the zSax anchor is projected from an upper and lower line, and tends to become extremely large for the next point comprising a currentSaxTuple not in $\mathcal{I}_K$. In the example of FIG. 9, $Q_R$[i+m] would likely be found admissible whatever its value, due to the large size of the admissible range defined by the zSax anchor at that point, possibly causing previously-compressed points to become out-of-bounds for the adjusted region after its consideration. To address this circumstance, an embodiment may perform an adjustment of the admissible regions when a point is found to be incompressible. One example of this approach is denoted at 1000 in FIG. 10.

Figure 10:
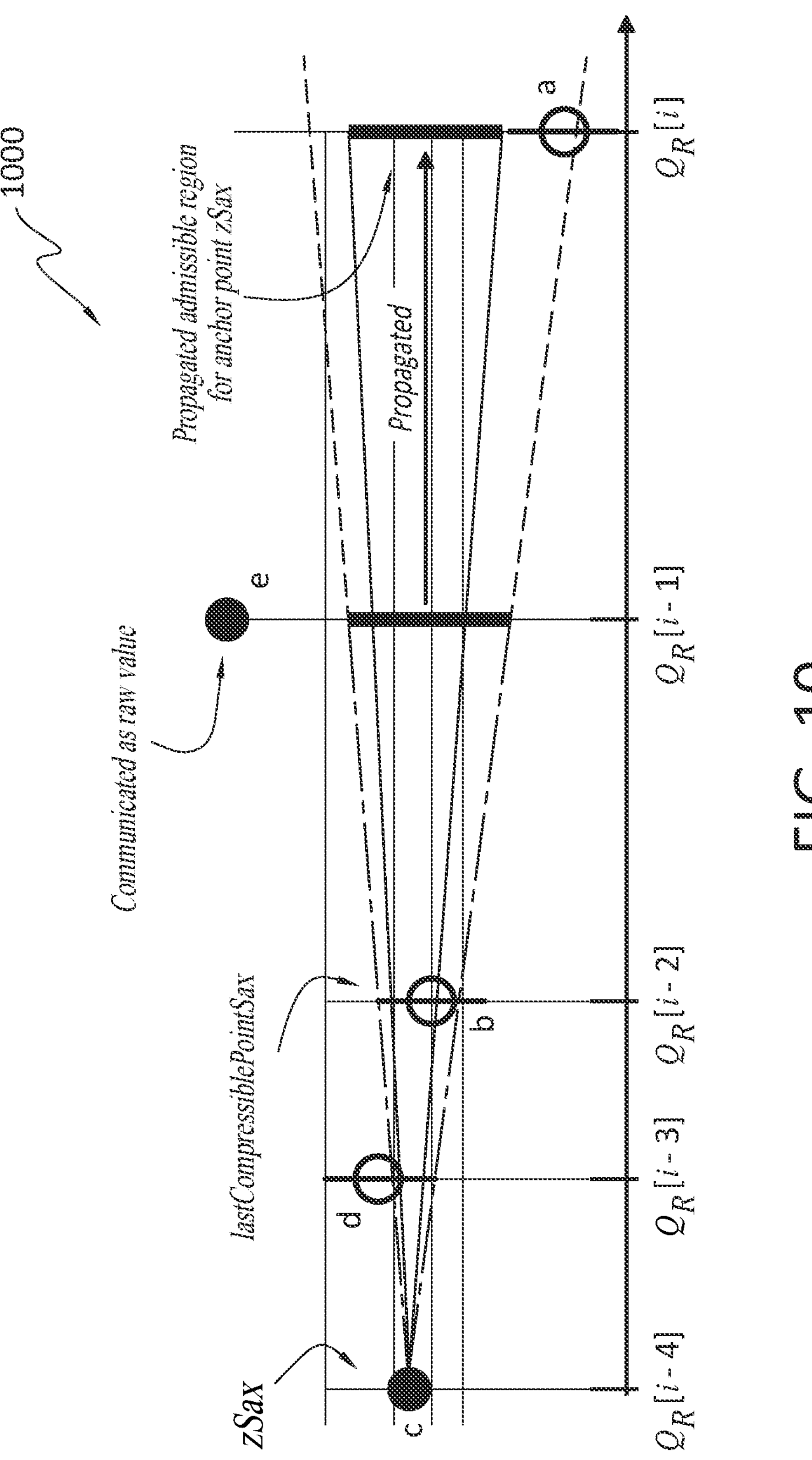
FIG. 10 discloses adjustment of a propagated admissible region.

Particularly, FIG. 10 discloses an approach for adjustment of the propagated admissible region when a point is added to the rawValueStream. The example of FIG. 10 illustrates an alternative case in which, after a point is communicated as a raw value, that is, the point is added to the rawValueStream, the current size of the admissible region is propagated to the next current point, at the next iteration. This approach prevents the admissible regions from growing indefinitely in cases in which there is a large time difference between the lastCompressiblePointSax and the next point $Q_R$[i], as referred to above in the discussion of FIG. 9. These instances may happen naturally in the series, but this approach may make them much more common by ignoring the points communicated as raw values.

D. Example Experiments and Results

For the experiments referred to in this section, the inventors implemented the Algorithm 1 SAX-RLTC in Python and obtained the sets $\mathcal{I}_K$ and $\mathcal{C}_k$ based on an ad-hoc analysis of the benchmark time series datasets. The inventors experimented with datasets typical to the time series domain. These datasets were chosen so that they represent different classes of IoT timeseries. Each dataset contained 50,000 samples and was normalized to zero mean and unit variance. Experiments were performed to compare the results between the baseline approach (see, e.g., FIG. 5) and an approach according to one embodiment (see, e.g., FIG. 6), referred to in the discussion of experimental results as the 'Illustrative Embodiment.' The results of the experiments are as follows.

Ratio: the compression ratio achieved by the algorithm:

$$\frac{\text{uncompressed}}{\text{compressed}}$$

samples.

Larger values are better.

Time: execution time in seconds for comparable implementations of an approach according to the Illustrative Embodiment, and the baseline compression approach (i.e., S-RLTC versus RLTC).

Smaller values are better.

In the case of S-RLTC, the time comprises the time for all orchestration (including computing the SAX symbols of the values on the fly).

Error: the error rate. Average error rate for all samples in the dataset after reconstruction by simple interpolation, at the same time indexes of the original data.

Smaller values are better.

D.1 IoT Telemetry Benchmark

Figures 11A, 11B:
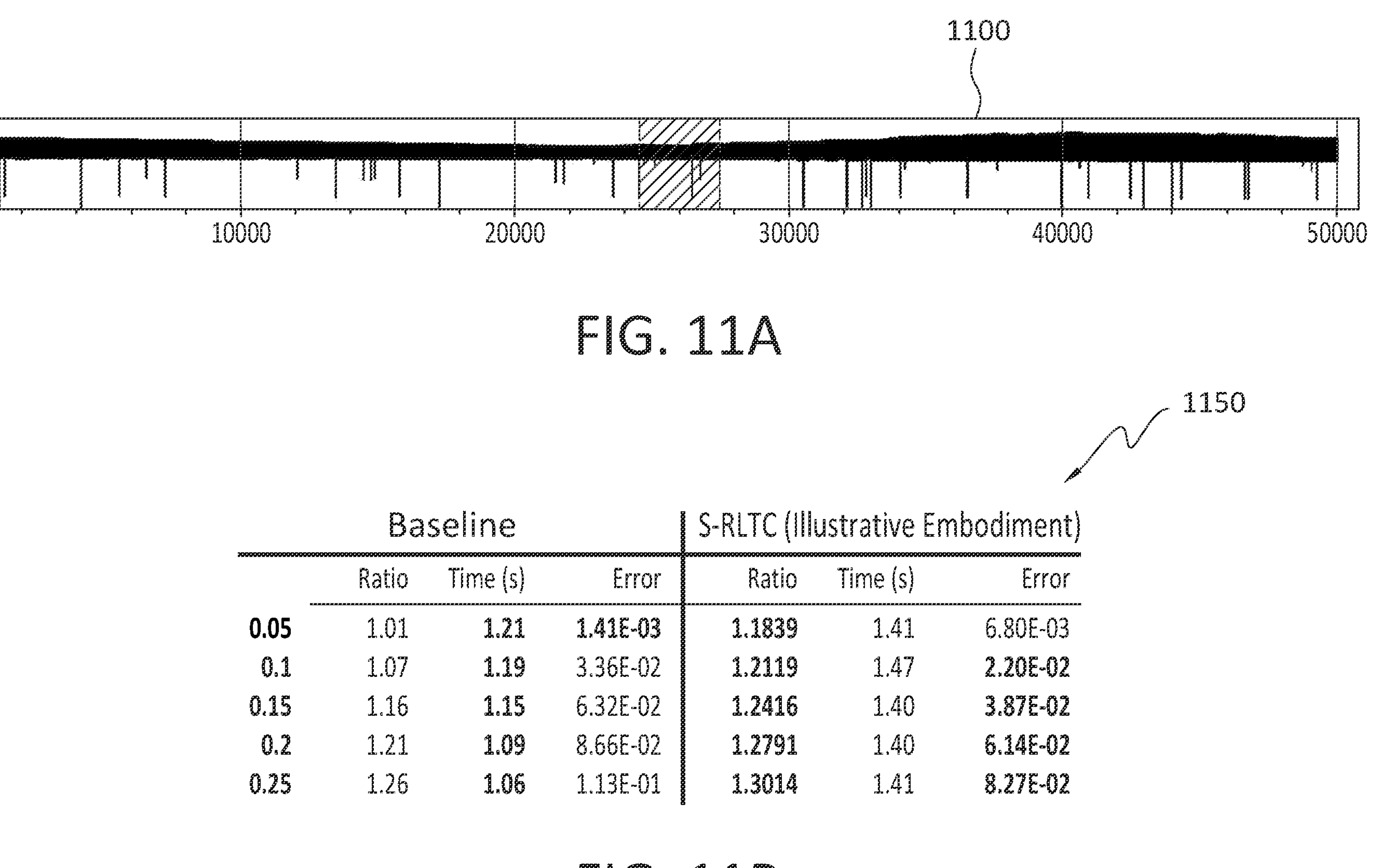
FIG. 11*a* discloses a graph of experimental data from an IoT telemetry benchmark scenario.
FIG. 11*b* discloses a table that includes experimental data from the IoT telemetry benchmark scenario.

The main benchmark considered comprised a series of IoT telemetry data 1100 as shown in FIG. 1*a*. FIG. 11*b* discloses a table 1150 of results for the IoT telemetry series dataset of 50,000 samples.

In the table 1150, each row contains the results for a specific parametrized error bound ε. Best values in each row, for each of the comparison metrics, are in bold. The results highlight some advantages of the Illustrative Embodiment. For example, the compression ratio (that is, total size divided by compressed size) improves substantially in all cases, most significantly for lower error bounds, when RLTC is not able to compress much. The error rates are also improved. The error rate provided in the Illustrative Embodiment is consistently ~70% of the error rate of the baseline approach, except for extremely low error bounds.

As expected, due to the higher orchestration requirements, the example approach of the Illustrative Embodiment takes longer to compute. However, this may not be as relevant as it may first appear, since the RLTC algorithm imposes a delay for communication of a sample. That is, RLTC only communicates samples upon resetting the anchors and, thus, the gateway or other target is unable to obtain any values since the last communicated anchor.

It is also noted that the Illustrative Embodiment is not as optimized as possible-both in terms of data structures, as well as regarding the quantization adopted. The inventors have adopted the SAX symbols, and SAX symbol sequences, due to their known usage. Alternative quantization schemes, which may be employed in some embodiments, may be much faster, and therefore greatly diminish the time difference between the baseline and S-RLTC. Finally, the baseline RLTC algorithm is extremely fast, and therefore many domains may be able to spare the extra computational time for enhanced error and compression ratios.

D.2 IoT Temperature Benchmark

Figures 12A, 12B:
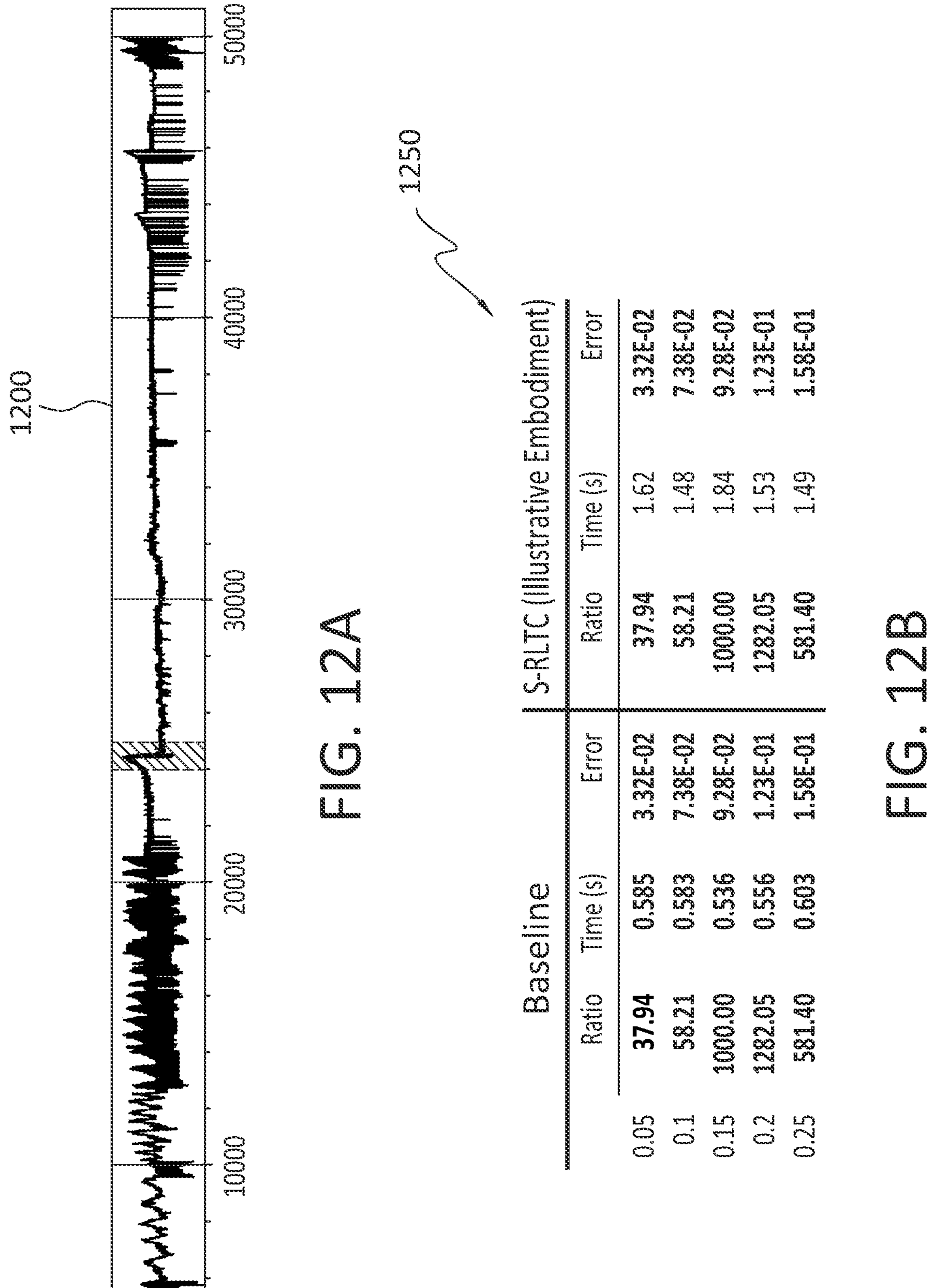
FIG. 12*a* discloses a graph of experimental data from an IoT temperature benchmark scenario.
FIG. 12*b* discloses a table that includes experimental data from the IoT temperature benchmark scenario.

In this example, a second dataset for benchmark is presented. It is also representative of IoT data, comprising two mixed temperature series. Regardless, it was found that both RLTC and S-RLTC are able to perform well. With attention now to FIG. 12*a*, example results 1200 for an IoT Temperature series dataset, comprising 50,000 samples, are shown.

In general, the results in the table 1250 are comparable with those for the IoT telemetry benchmark. The same conclusions apply here. That is, S-RLTC achieves significantly better compression ratio, with smaller error, and only less than ~1 second additional computational time, in the worst scenario, for processing all 50 thousand samples.

D.3 IoT Smoke Detection Benchmark

Figures 13A, 13B:
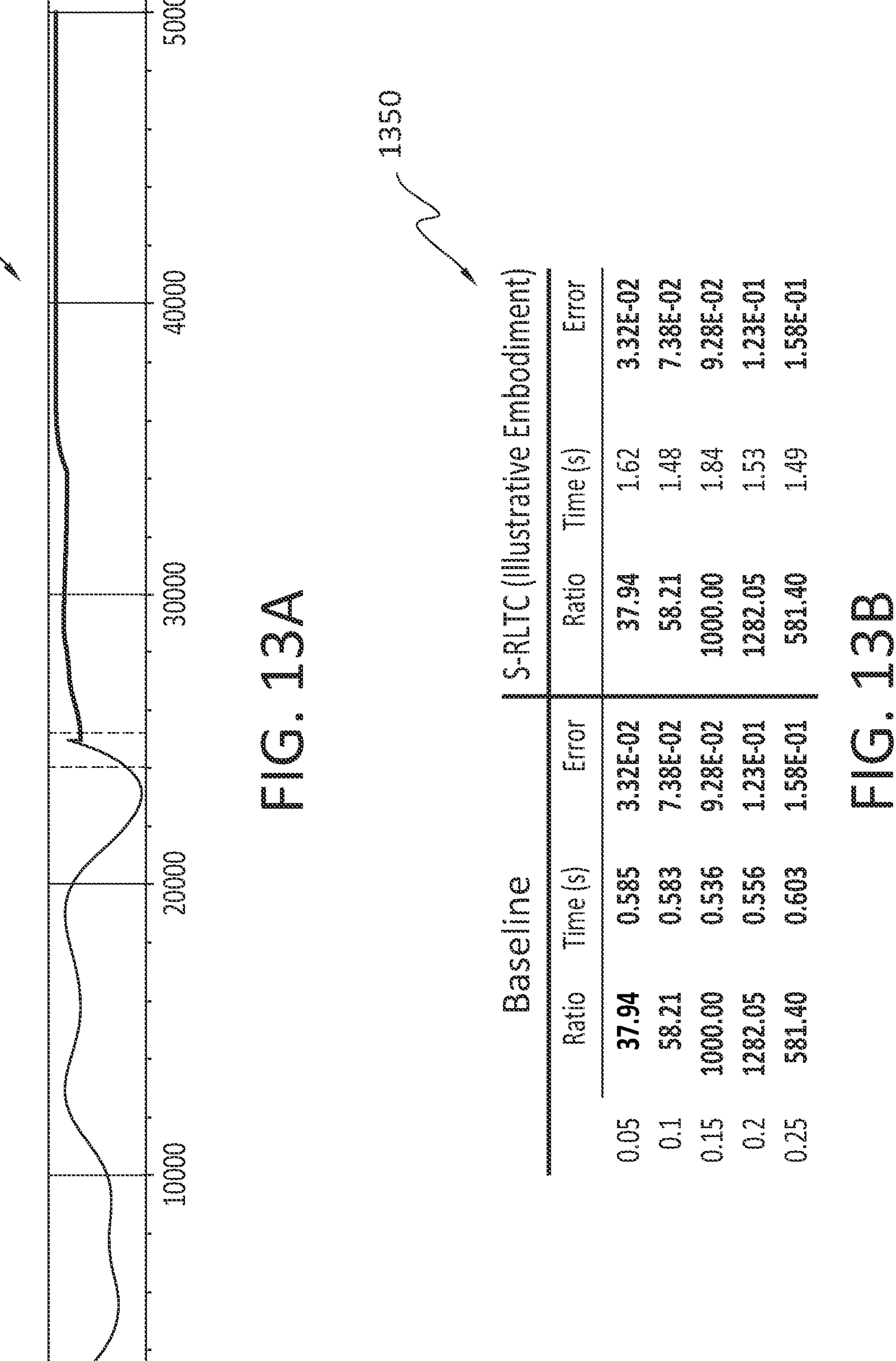
FIG. 13*a* discloses a graph of experimental data from an IoT smoke detection benchmark scenario.
FIG. 13*b* discloses a table that includes experimental data from the IoT smoke detection benchmark scenario.

The final experimental benchmark is a dataset with extreme compressibility by the baseline RLTC-a very smooth, and well-behaved, time series. With attention now to FIG. 13*a*, example results 1300 for an IoT Smoke Detection series dataset, comprising 50,000 samples, are shown.

The example results in the table 1350 indicate how S-RLTC will 'degrade' into the baseline RLTC approach when the series is highly compressible. For example, with an error bound of 0.15, RLTC compresses the 50 K samples down to only 50, yielding a compression ratio of 1000. In this illustrative scenario, S-RLTC achieves exactly the same ratios and errors as RLTC. Additional mechanisms to detect that the series is highly compressible could be devised, so as to avoid the overhead, which results in additional computational time, imposed by S-RLTC.

E. Example Methods

It is noted with respect to the disclosed methods, including the example respective methods of FIGS. 6-10, that any operation(s) of any of these methods, may be performed in response to, as a result of, and/or, based upon, the performance of any preceding operation(s). Correspondingly, performance of one or more operations, for example, may be a predicate or trigger to subsequent performance of one or more additional operations. Thus, for example, the various operations that may make up a method may be linked together or otherwise associated with each other by way of relations such as the examples just noted. Finally, and while it is not required, the individual operations that make up the various example methods disclosed herein are, in some embodiments, performed in the specific sequence recited in those examples. In other embodiments, the individual operations that make up a disclosed method may be performed in a sequence other than the specific sequence recited.

F. Further Example Embodiments

Following are some further example embodiments of the invention. These are presented only by way of example and are not intended to limit the scope of the invention in any way.

Embodiment 1. A method, comprising: at a source, performing a symbolic aggregation process on a series of raw data generated and/or collected by the source, to create a series of symbols; inputting, by the source, the series of raw data and the series of symbols to a lossy compression algorithm operating at the source; running, at the source, the lossy compression algorithm to obtain a series of raw values, and a sparse series of raw values; and transmitting, by the source to a target, the series of raw values, and the sparse series of raw values.

Embodiment 2. The method as recited in any preceding embodiment, wherein the symbolic aggregation process comprises the SAX process.

Embodiment 3. The method as recited in any preceding embodiment, wherein the lossy compression algorithm comprises the S-RLTC algorithm.

Embodiment 4. The method as recited in any preceding embodiment, wherein the source comprises an IoT (Internet of Things) device, and the target comprises a gateway.

Embodiment 5. The method as recited in any preceding embodiment, wherein the series of raw values, and the sparse series of raw values, are able to be reconstructed together at a gateway.

Embodiment 6. The method as recited in any preceding embodiment, wherein the series of raw data comprises time series data.

Embodiment 7. The method as recited in any preceding embodiment, wherein the raw data and the series of symbols input to the lossy compression algorithm collectively define a first sequence of symbols that corresponds to compressible patterns, and also define a second sequence of symbols that corresponds to incompressible patterns.

Embodiment 8. The method as recited in any preceding embodiment, wherein the lossy compression algorithm is selectively turned off for raw data that is not sufficiently compressible.

Embodiment 9. The method as recited in any preceding embodiment, wherein performing the symbolic aggregation process improves an efficiency of the lossy compression algorithm, as compared with the efficiency of the lossy compression algorithm if the symbolic aggregation were not performed prior to the running of the lossy compression algorithm.

Embodiment 10. The method as recited in any preceding embodiment, wherein an efficiency of the lossy compression algorithm is improved by applying an outlier detection scheme to the series of raw data and/or to the series of symbols input to the lossy compression algorithm.

Embodiment 11. A system, comprising hardware and/or software, operable to perform any of the operations, methods, or processes, or any portion of any of these, disclosed herein.

Embodiment 12. A non-transitory storage medium having stored therein instructions that are executable by one or more hardware processors to perform operations comprising the operations of any one or more of embodiments 1-10.

G. Example Computing Devices and Associated Media

The embodiments disclosed herein may include the use of a special purpose or general-purpose computer including various computer hardware or software modules, as discussed in greater detail below. A computer may include a processor and computer storage media carrying instructions that, when executed by the processor and/or caused to be executed by the processor, perform any one or more of the methods disclosed herein, or any part(s) of any method disclosed.

As indicated above, embodiments within the scope of the present invention also include computer storage media, which are physical media for carrying or having computer-executable instructions or data structures stored thereon. Such computer storage media may be any available physical media that may be accessed by a general purpose or special purpose computer.

By way of example, and not limitation, such computer storage media may comprise hardware storage such as solid state disk/device (SSD), RAM, ROM, EEPROM, CD-ROM, flash memory, phase-change memory ("PCM"), or other optical disk storage, magnetic disk storage or other magnetic storage devices, or any other hardware storage devices which may be used to store program code in the form of computer-executable instructions or data structures, which may be accessed and executed by a general-purpose or special-purpose computer system to implement the disclosed functionality of the invention. Combinations of the above should also be included within the scope of computer storage media. Such media are also examples of non-transitory storage media, and non-transitory storage media also embraces cloud-based storage systems and structures, although the scope of the invention is not limited to these examples of non-transitory storage media.

Computer-executable instructions comprise, for example, instructions and data which, when executed, cause a general purpose computer, special purpose computer, or special purpose processing device to perform a certain function or group of functions. As such, some embodiments of the invention may be downloadable to one or more systems or devices, for example, from a website, mesh topology, or other source. As well, the scope of the invention embraces any hardware system or device that comprises an instance of an application that comprises the disclosed executable instructions.

Although the subject matter has been described in language specific to structural features and/or methodological acts, it is to be understood that the subject matter defined in the appended claims is not necessarily limited to the specific features or acts described above. Rather, the specific features and acts disclosed herein are disclosed as example forms of implementing the claims.

As used herein, the term 'module' or 'component' may refer to software objects or routines that execute on the computing system. The different components, modules, engines, and services described herein may be implemented as objects or processes that execute on the computing system, for example, as separate threads. While the system and methods described herein may be implemented in software, implementations in hardware or a combination of software and hardware are also possible and contemplated. In the present disclosure, a 'computing entity' may be any computing system as previously defined herein, or any module or combination of modules running on a computing system.

In at least some instances, a hardware processor is provided that is operable to carry out executable instructions for performing a method or process, such as the methods and processes disclosed herein. The hardware processor may or may not comprise an element of other hardware, such as the computing devices and systems disclosed herein.

In terms of computing environments, embodiments of the invention may be performed in client-server environments, whether network or local environments, or in any other suitable environment. Suitable operating environments for at least some embodiments of the invention include cloud computing environments where one or more of a client, server, or other machine may reside and operate in a cloud environment.

Figure 14:
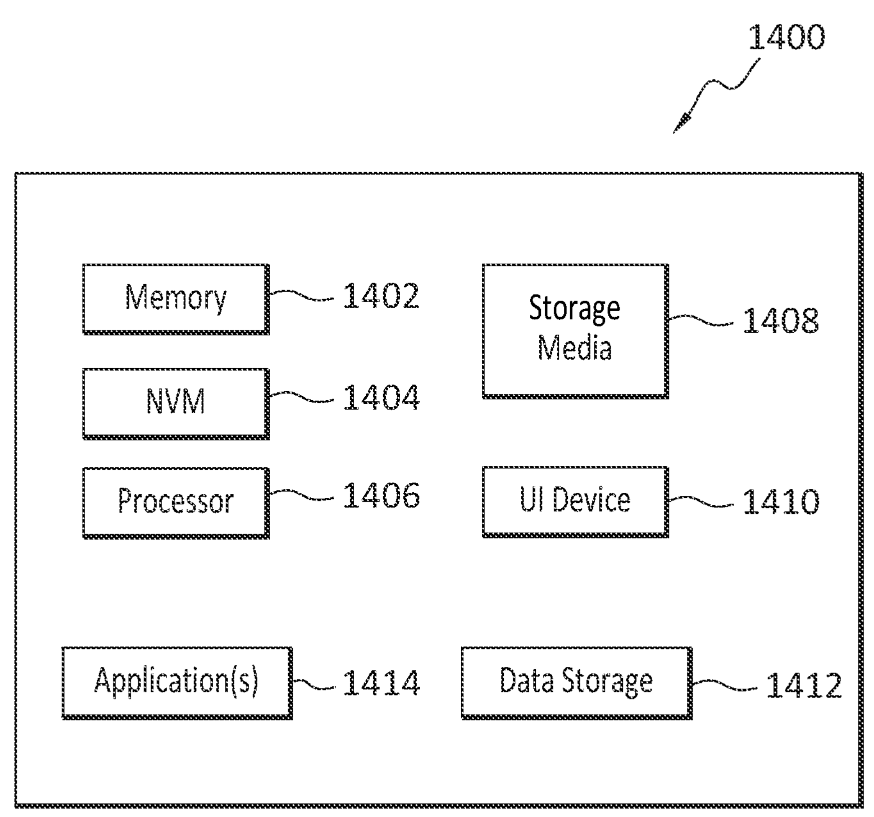
FIG. 14 discloses an example computing entity configured and operable to perform any of the disclosed methods, processes, and operations.

With reference briefly now to FIG. 14, any one or more of the entities disclosed, or implied, by FIGS. 1-13*b*, and/or elsewhere herein, may take the form of, or include, or be implemented on, or hosted by, a physical computing device, one example of which is denoted at 1400. As well, where any of the aforementioned elements comprise or consist of a virtual machine (VM), that VM may constitute a virtualization of any combination of the physical components disclosed in FIG. 14.

In the example of FIG. 14, the physical computing device 1400 includes a memory 1402 which may include one, some, or all, of random access memory (RAM), non-volatile memory (NVM) 1404 such as NVRAM for example, read-only memory (ROM), and persistent memory, one or more hardware processors 1406, non-transitory storage media 1408, UI device 1410, and data storage 1412. One or more of the memory components 1402 of the physical computing device 1400 may take the form of solid state device (SSD) storage. As well, one or more applications 1414 may be provided that comprise instructions executable by one or more hardware processors 1406 to perform any of the operations, or portions thereof, disclosed herein.

Such executable instructions may take various forms including, for example, instructions executable to perform any method or portion thereof disclosed herein, and/or executable by/at any of a storage site, whether on-premises at an enterprise, or a cloud computing site, client, datacenter, data protection site including a cloud storage site, or backup server, to perform any of the functions disclosed herein. As well, such instructions may be executable to perform any of the other operations and methods, and any portions thereof, disclosed herein.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A method, comprising:

at a source, performing a symbolic aggregation process on a series of raw data generated and/or collected by the source, to create a series of symbols;

inputting, by the source, the series of raw data and the series of symbols to a lossy compression algorithm operating at the source;

running, at the source, the lossy compression algorithm to obtain a series of raw values, and a sparse series of raw values; and transmitting, by the source to a target, the series of raw values, and the sparse series of raw values.

2. The method as recited in claim 1, wherein the symbolic aggregation process comprises the SAX (Symbolic Aggregate Approximation) process.

3. The method as recited in claim 1, wherein the lossy compression algorithm comprises the S-RLTC (Symbolic Aggregate Approximation Based Refined Lightweight Temporal Compression) algorithm.

4. The method as recited in claim 1, wherein the source comprises an IoT (Internet of Things) device, and the target comprises a gateway.

5. The method as recited in claim 1, wherein the series of raw values, and the sparse series of raw values, are able to be reconstructed together at a gateway.

6. The method as recited in claim 1, wherein the series of raw data comprises time series data.

7. The method as recited in claim 1, wherein the raw data and the series of symbols input to the lossy compression algorithm collectively define a first sequence of symbols that corresponds to compressible patterns, and also define a second sequence of symbols that corresponds to incompressible patterns.

8. The method as recited in claim 1, wherein the lossy compression algorithm is selectively turned off for raw data that is not sufficiently compressible.

9. The method as recited in claim 1, wherein performing the symbolic aggregation process improves an efficiency of the lossy compression algorithm, as compared with the efficiency of the lossy compression algorithm if the symbolic aggregation were not performed prior to the running of the lossy compression algorithm.

10. The method as recited in claim 1, wherein an efficiency of the lossy compression algorithm is improved by applying an outlier detection scheme to the series of raw data and/or to the series of symbols input to the lossy compression algorithm.

11. A non-transitory storage medium having stored therein instructions that are executable by one or more hardware processors to perform operations comprising:

at a source, performing a symbolic aggregation process on a series of raw data generated and/or collected by the source, to create a series of symbols;

inputting, by the source, the series of raw data and the series of symbols to a lossy compression algorithm operating at the source;

running, at the source, the lossy compression algorithm to obtain a series of raw values, and a sparse series of raw values; and transmitting, by the source to a target, the series of raw values, and the sparse series of raw values.

12. The non-transitory storage medium as recited in claim 11, wherein the symbolic aggregation process comprises the SAX (Symbolic Aggregate Approximation) process.

13. The non-transitory storage medium as recited in claim 11, wherein the lossy compression algorithm comprises the S-RLTC (Symbolic Aggregate Approximation Based Refined Lightweight Temporal Compression) algorithm.

14. The non-transitory storage medium as recited in claim 11, wherein the source comprises an IoT (Internet of Things) device, and the target comprises a gateway.

15. The non-transitory storage medium as recited in claim 11, wherein the series of raw values, and the sparse series of raw values, are able to be reconstructed together at a gateway.

16. The non-transitory storage medium as recited in claim 11, wherein the series of raw data comprises time series data.

17. The non-transitory storage medium as recited in claim 11, wherein the raw data and the series of symbols input to the lossy compression algorithm collectively define a first sequence of symbols that corresponds to compressible patterns, and also define a second sequence of symbols that corresponds to incompressible patterns.

18. The non-transitory storage medium as recited in claim 11, wherein the lossy compression algorithm is selectively turned off for raw data that is not sufficiently compressible.

19. The non-transitory storage medium as recited in claim 11, wherein performing the symbolic aggregation process improves an efficiency of the lossy compression algorithm, as compared with the efficiency of the lossy compression algorithm if the symbolic aggregation were not performed prior to the running of the lossy compression algorithm.

20. The non-transitory storage medium as recited in claim 11, wherein an efficiency of the lossy compression algorithm is improved by applying an outlier detection scheme to the series of raw data and/or to the series of symbols input to the lossy compression algorithm.

* * * * *